(12) United States Patent  (10) Patent No.: US 8,785,298 B2
Van der Stam et al.  (45) Date of Patent: Jul. 22, 2014

(54) METHOD OF SINGULATING A THIN SEMICONDUCTOR WAFER

(71) Applicant: Advanced Laser SeparationInternational (ALSI) N.V., Beuningen (NL)

(72) Inventors: Karel Maykel Richard Van der Stam, Apeldoorn (NL); Rogier Evertsen, Arnehm (NL); Guido Martinus Henricus Knippels, Schijndel (NL)

(73) Assignee: ASM Technology Singapore Pte. Ltd., Singapore (SG)

( * ) Notice: Subject to any disclaimer, the term of this patent is extended or adjusted under 35 U.S.C. 154(b) by 0 days.

(21) Appl. No.: 13/796,384

(22) Filed: Mar. 12, 2013

(65) Prior Publication Data

US 2013/0244404 A1 Sep. 19, 2013

(30) Foreign Application Priority Data

Mar. 16, 2012 (EP) ..................................... 12001831

(51) Int. Cl.
*H01L 21/00* (2006.01)
(52) U.S. Cl.
USPC ......................................................... 438/462

(58) Field of Classification Search
CPC ....................................................... H01L 21/78
USPC ............................... 438/462, 463; 219/121.68
See application file for complete search history.

(56) References Cited

U.S. PATENT DOCUMENTS

| 6,770,544 | B2 | 8/2004 | Sawada |
| 7,804,043 | B2 | 9/2010 | Deshi |
| 2007/0298529 | A1 | 12/2007 | Maeda et al. |
| 2010/0197116 | A1* | 8/2010 | Shah et al. .................... 438/463 |
| 2011/0287607 | A1* | 11/2011 | Osako et al. .................. 438/462 |
| 2013/0217153 | A1* | 8/2013 | Knippels et al. ................. 438/7 |

* cited by examiner

*Primary Examiner* — Bradley K Smith
(74) *Attorney, Agent, or Firm* — Pillsbury Winthrop Shaw Pittman, LLP

(57) ABSTRACT

A method of singulating a semiconductor wafer having two surfaces separated by a thickness T<200 μm includes partitioning it along a network of scribelines on one side. The other side is secured to an elastic foil, which is clamped to a wafer table. A radiative scribing tool is used to produce at least one laser beam having a pulse duration P≤75 ps, and causing the laser beam to scan along each of the scribelines so as to create a scribe with a depth D<T, thereby leaving the second surface intact. The foil is laterally stretched to sever the second major surface along the path of the scribes. In an embodiment, P<$C_{PP}$, the Time Constant of phonon-phonon coupling in the wafer at the location of incidence of the laser beam.

10 Claims, 4 Drawing Sheets

METHOD OF SINGULATING A THIN SEMICONDUCTOR WAFER

This application claims priority to EP 12001831.2, filed Mar. 16, 2012, which is herein incorporated by reference in its entirety.

FIELD OF THE INVENTION

The invention relates to a method of singulating a semiconductor wafer by partitioning it along a network of scribelines, the wafer having two substantially parallel major surfaces that are separated from one another by a thickness $T<200$ µm, said scribelines extending along (at least) a first of said major surfaces.

The invention also relates to an apparatus constructed and arranged to perform such a method.

BACKGROUND OF THE INVENTION

For purposes of clarity and consistency, the following terms as used throughout this text and the appended claims should be interpreted as follows:

The phrase "semiconductor wafer" should be broadly interpreted as encompassing any substrate on which a semiconductor device or other integrated device is manufactured. Such substrates may, for example, comprise silicon or germanium wafers (of various diameters), and/or wafers of compound substances such as InAs, InSb, InP, GaSb, GaP or GaAs. The term also encompasses non-semiconductor materials (such as sapphire) on which one or more layers of semiconductor material have been deposited, e.g., as in the manufacture of LEDs. The semiconductor device or other integrated device concerned may, for example, be an integrated circuit, (passive) electronic component, opto-electronic component, biological chip, MEMS device, etc. Such devices will generally be manufactured in large numbers on a given substrate, and will typically be laid out in a matrix arrangement on at least one of said major surfaces. This matrix arrangement is delimited by said network of scribelines.

The term "scribeline" (also sometimes referred to as a "scribelane") should be interpreted as referring to a (real or abstract) line extending along said major surface of the wafer, along which line the wafer is (ultimately) to be severed. In the case of a processed semiconductor wafer, a scribeline will generally lie in a "street" that extends between neighboring rows of integrated devices on the wafer, along which street the wafer is to be "diced" so as to allow separation of the devices in question. This procedure is conventionally referred to as "singulation".

The term "network" should be broadly interpreted as encompassing regular and non-regular repetitive configurations. For example, some wafers may comprise a regular matrix of identical integrated devices separated from one another by scribelines forming a regular orthogonal network. On the other hand, other wafers may comprise devices of different sizes, and/or located at non-regular pitches with respect to one another, implying a correspondingly irregular configuration of scribelines.

These points will be discussed in more detail below.

Silicon semiconductor wafers are conventionally of the order of about 0.8 mm thick. Recently, semiconductor manufacturers have started to investigate the possible use of "thin" wafers, which will here be defined as wafers having a thickness $T<200$ µm, e.g., with T in the range 30-120 µm, or even less. Such thin wafers have various promising applications, such as:

In manufacturing stacked memories. In this case, use of a thin wafer means that more memory chips can be stacked within a given vertical space.

In manufacturing processors. In this case, use of a thin wafer may allow more efficient heat dissipation from an active processor device through its underlying substrate (a portion of the wafer) and into an adjacent heat sink.

The use of a thinner wafer may also contribute to: cost reduction, due to the use of less substrate material and less filler material (e.g., copper) in so-called vias (i.e., connective passages) penetrating the wafer, and device speed increases, since a thinner substrate will generally support higher signal frequencies.

Unfortunately, the processing of thin wafers may involve associated problems. In particular, it has transpired that thin wafers may be difficult to singulate whilst maintaining an acceptable device yield. More specifically, the inventors have observed that if a thin wafer is mechanically singulated using a saw, many of the singulated devices emerge from the singulation process in a mechanically broken state. Furthermore, if a thin wafer is radiatively singulated using a laser beam, the singulated devices may emerge from the singulation process apparently intact but nevertheless weakened, because many of them go on to break and/or electrically fail during subsequent processing and/or usage.

Such setbacks are hampering the successful application of thin wafers in the semiconductor manufacturing industry.

Aspects of embodiments address these and other issues.

SUMMARY OF THE INVENTION

In an embodiment, a method of singulating a semiconductor wafer having two substantially parallel major surfaces that are separated from one another by a thickness $T<200$ µm includes partitioning it along a network of scribelines extending along a first of said major surfaces. The method further includes adhering the second major surface of the wafer to an elastic foil, which is clamped to a wafer table so as to present the first major surface to a radiative scribing tool, using the radiative scribing tool to produce at least one pulsed laser beam having a pulse duration $P \leq 75$ ps, causing said laser beam to scan along each of said scribelines so as to create a radiative scribe with a depth $D<T$, thereby leaving the second major surface intact, and laterally stretching said foil so as to sever the second major surface along the path of said radiative scribes.

BRIEF DESCRIPTION OF THE DRAWINGS

The invention will now be elucidated in more detail on the basis of exemplary embodiments and the accompanying schematic drawings, in which.

In the Figures, where pertinent, corresponding parts are indicated using corresponding reference symbols.

DETAILED DESCRIPTION

Figure 1:
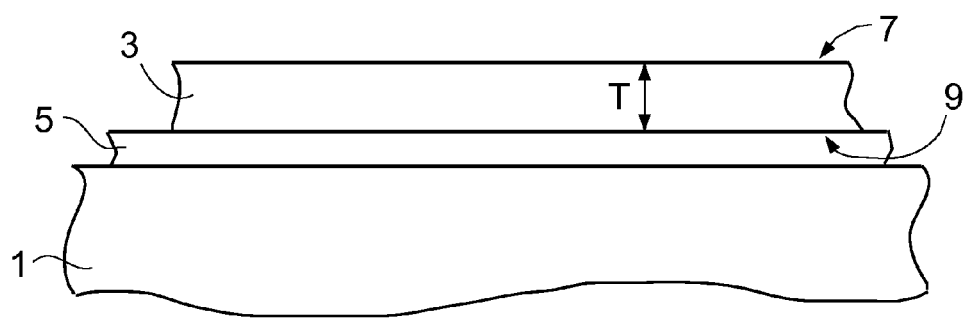
FIG. 1 renders a cross-sectional view of a first aspect of the current invention, featuring a thin semiconductor wafer awaiting singulation using the inventive method.

For the avoidance of doubt: although the skilled artisan in the field of wafer singulation will already be familiar with this terminology, the term "radiative scribing tool" is here intended to refer to an optical assembly that can be used to produce and direct a scribing laser beam. Such a tool will generally comprise at least one laser source and associated imaging/focusing optics. It may also comprise one or more ancillary components, such as: one or more beam splitters, diffractive optical elements or filters, for performing specific processing operations on said laser beam, an image recording device, for monitoring the alignment/position of the scribing laser beam relative to a wafer being scribed, and a controller/processor, for instance. Such tools are well known in the art of wafer singulation: see, for example, U.S. Pat. Nos. 5,922,224 and 7,947,920, which are incorporated herein by reference.

In experiments leading to the present invention, the inventors determined the following:

The breakage of separated devices emerging from a mechanical singulation procedure, such as sawing, is due in large part to significant in-plane stress forces and vibration arising during the singulation process. A thin wafer is less able to absorb and withstand such forces/vibration than a thick wafer. The inventors observed that this problem is generally exacerbated by the fact that a saw used to cut thin wafers typically tends to blunt more quickly than a saw used to cut thicker wafers.

The mechanical weakening of separated devices emerging from a radiative singulation process is due to thermal shock created in the wafer by the impinging laser beam. Once again, a thin wafer is generally less able to absorb and withstand such thermal shock than a thick wafer.

The inventors have determined that if radiative scribing is performed using sufficiently short laser pulses (more specifically of the order of about 75 picoseconds (ps) or less), then one achieves energy bursts that are shorter than (or, at most, comparable to) the Time Constant of phonon-phonon coupling in the wafer bulk at the location of incidence of the laser beam (which Time Constant is hereinafter denoted by $C_{PP}$). In such a scenario, energy imparted by the laser pulses will basically be absorbed in two manners, namely:

(i) By transfer of energy to electrons in the wafer. This direct transfer mechanism creates a highly localized free electron gas (free carrier gas); and (ii) By limited transfer of energy from electrons to phonons in the wafer. This indirect transfer mechanism results in a confined diffusion of energy into a relatively small volume of the wafer lattice/bulk proximal to said free electron gas.

In both cases, because $P<C_{PP}$, a knock-on relay of energy transfer from phonon to phonon within the lattice is inhibited; as a result, widespread diffusion of incident energy into the lattice/bulk of the wafer at large is curtailed and, consequently, the wafer undergoes less thermal shock.

An additional aspect of using such short laser pulses is that each pulse will generally only ablate the wafer to a relatively shallow depth, e.g., of the order of about 10 μm. As a result, in a typical thin wafer (e.g., with T≈100 μm), a common radiative scribe (e.g., with D≈80 μm) will generally require several passes of the scribing laser along a given scribeline (e.g., about eight in the specific examples given here). Because ablative energy is directed at the wafer in multiple small steps rather than a single large step, the wafer will generally suffer less shock. This is due inter alia to the fact that the mechanical recoil/compression forces in the wafer in response to the incoming radiation pressure in each laser pulse are very significantly reduced.

If radiative scribing stops short of traversing the entire thickness of the wafer, and is instead terminated within the bulk of the wafer, explosive emergence of the employed laser beam at the backside (second major surface) of the wafer is prevented. The inventors have observed that such explosive emergence generates shock waves that can be particularly weakening in the case of a thin wafer.

Performing radiative scribing only to a certain depth within a thin wafer—thereby leaving the wafer backside (second major surface) intact by allowing a small "floor" to remain under the radiative scribe—creates a very effective scenario that the inventors refer to as a "sacrificial stress-release shunt". Undesirable thermal stressing of the thin wafer—due to the asymmetric head load caused by one-sided irradiation during radiative scribing of the first major surface—can subsequently be "channeled" or "diverted" from the devices into said "floors" by laterally stretching the composite foil/wafer, and the accumulation of this channeled stress in the floors causes them to break. In this way, residual stress in the devices is greatly mitigated, by offloading (shunting) it into the sacrificial floors.

Laterally stretching the composite foil/wafer is the best way to exploit this sacrificial stress-release shunt mechanism. If the composite foil/wafer is instead subjected to other mechanical processing—such as flexing/bending/rolling or vibration, for example—then the inventors have observed that damage to the resulting singulated devices can, as yet, occur. In particular, the inventors have observed that such alternative mechanical processing can lead to cracking of the corners of the separated devices. Nevertheless, a slight degree of bending as a supplement to simultaneously performed stretching can serve to improve singulation results, depending on the circumstances of a particular situation, such as wafer thickness, device area, and depth of the employed radiative scribe, for example.

In a refinement of the current invention, the laser pulse duration (pulse length) P is chosen to have a more restricted value, namely $P<C_{EP}$, in which $C_{EP}$ is the Time Constant of electron-phonon coupling in the wafer's bulk material at the location of incidence of the laser beam. Such a restriction basically confines energy transfer to mechanism (i) elucidated above, by curtailing mechanism (ii); as a result, transfer of energy from the laser pulse to the wafer is confined to a still smaller volume.

It should be noted that the radiative scribing tool employed in the current invention may, in fact, produce a plurality of laser beams, which concurrently impinge on the wafer along said scribeline; such a scenario is set forth, for example, in the aforementioned U.S. Pat. No. 5,922,224.

For the sake of completeness, reference is made to the following publications, which provide additional information on certain aspects set forth above (although such aspects will already be familiar to the skilled artisan):

As regards adhering a wafer to an elastic foil, spanning the foil in a frame, clamping the foil and frame to a wafer table, and ensuing stretching of the foil to effect separation of singulated dies: see, for example, United States patent documents US 2008/0196229 A1 and U.S. Pat. No. 5,979,728;

As regards phonon processes in semiconductor materials, see, for example, the journal article: S. Sinha, P. K. Schelling, S. R. Phillpot and K. E. Goodson, "Scattering of g-process longitudinal optical phonons at hotspots in silicon", J. Appl. Phys. 97, pp. 023702-1-023702-9 (2005), which publications are incorporated herein by reference.

In an exemplary method according to the present invention—which is not intended to be in any way limiting upon the scope of the invention but is merely presented here for the purpose of giving a concrete, practical example—the following conditions are satisfied:

The employed laser has a wavelength in the range 200-1500 nm and an output power in the range 100 mW-100 W. The chosen values will depend largely on the material of the wafer being scribed. Wavelengths in the specified range can be produced by a variety of lasers. For example, a solid-state Nd:YAG laser produces a wavelength of 1064 nm, with harmonics at 532 nm and 355 nm. Alternatively, one can use, for example a doped fiber laser with a wavelength of 1062 nm.

The employed wafer is a thin Si wafer with a thickness T in the range 20-200 μm, e.g., 120 μm. This wafer is adhered to a polymeric foil with a thickness of 90 μm, for example. This foil may comprise polyvinyl chloride (PVC) or a polyolefin such as polyethylene (PE), for example, which may be coated with an adhesive such as a UV-curable (acrylic) resin, for example. In the case of a silicon wafer, the Time Constant for phonon-phonon coupling has a value $C_{PP} \sim 50$ ps.

The input laser has a pulse duration of P=15 ps, and a pulse frequency in the range 5-200 kHz, e.g., 100 kHz.

In the case of the 120 μm wafer referred to above, radiative scribing of the wafer occurs to a depth D=100 μm. As a result, the "floor" remaining underneath the radiative scribe has a thickness F=T−D=20 μm.

After radiative scribing, the foil is laterally stretched so as to cause devices bordering a common scribeline to separate and move away from one another by an in-plane distance in the range 30-200 μm, for example.

Embodiment 1

Figure 2:
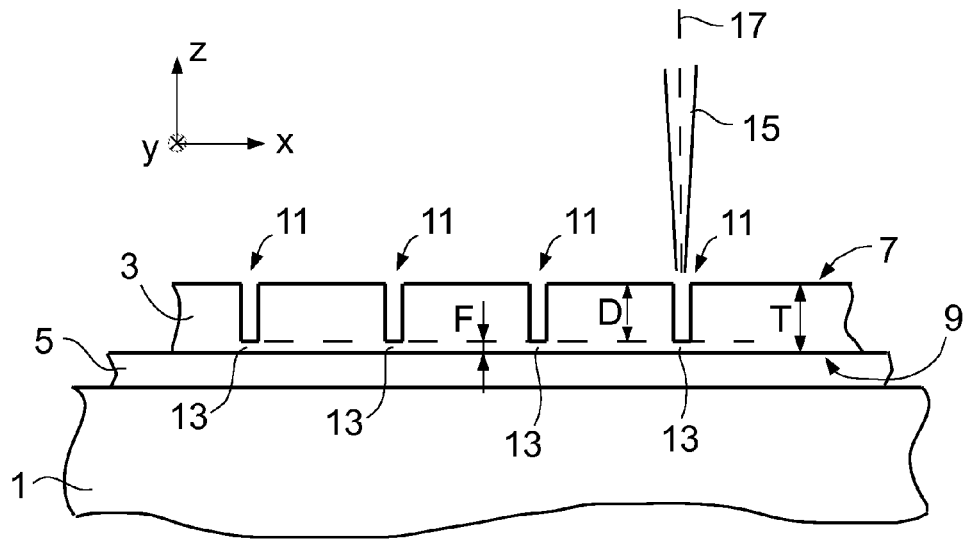
FIG. 2 depicts the subject of FIG. 1, after performing a particular step of the method according to the current invention.
Figure 3:
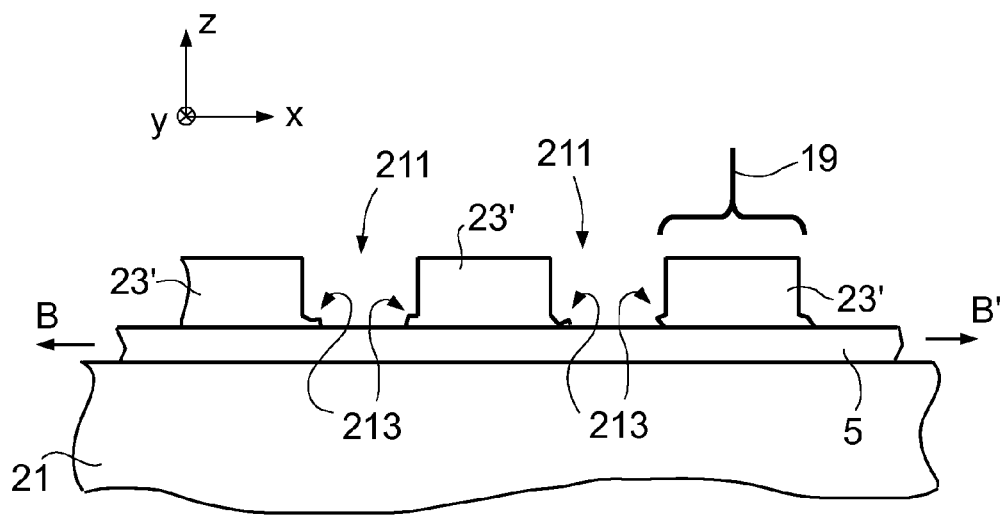
FIG. 3 depicts the subject of FIGS. 1 and 2, after performing a subsequent step of the method according to the current invention.

FIGS. 1-3 schematically depict various stages in an embodiment of a method according to the present invention. All figures render a cross-sectional view observed along a y axis of an x,y,z Cartesian co-ordinate system. The figures are not to scale.

FIG. 1 shows a wafer table 1 on which a thin semiconductor wafer 3 is held. Interposed between the wafer table 1 and wafer 3 is an elastic foil 5, onto which the wafer 3 is adhered. The wafer 3 has two substantially parallel major surfaces 7, 9, that are separated from one another by a thickness T<200 μm. The wafer 3 is thus mounted that its second major surface 9 contacts the foil 5 whereas its first major surface 7 is presented (in the z direction) to a radiative scribing tool (see FIG. 5). The foil 5 may, for example, be spanned within a circumferential frame (not shown) that is clamped to the table 1. As an example, the foil 5 may comprise commercially available dicing tape—for instance dicing tape available from Lintec of America, Inc., of Phoenix, Ariz.

Extending along the first major surface 7 is a network of scribelines 2 that run between semiconductor devices 23 on the surface 7 (see FIG. 4); when viewed along the −z axis, this network would have the form of an orthogonal grid, for example. The wafer 3 is to be singulated by partitioning it along these scribelines 2; in so doing, said devices 23—which are delimited along their edges by said scribelines 2—will be separated from one another.

In FIG. 2, radiative scribes 11 have been created along said scribelines. These scribes 11 extend along the scribelines in the y direction (and also the x direction, though this is not rendered by the Figures). The scribes 11 have a depth D (in the −z direction) which is less than T. Since D<T, the second major surface 9 remains intact, and each scribe 11 thus sits atop a floor 13. The thickness of this floor is F=T−D.

Figure 5:
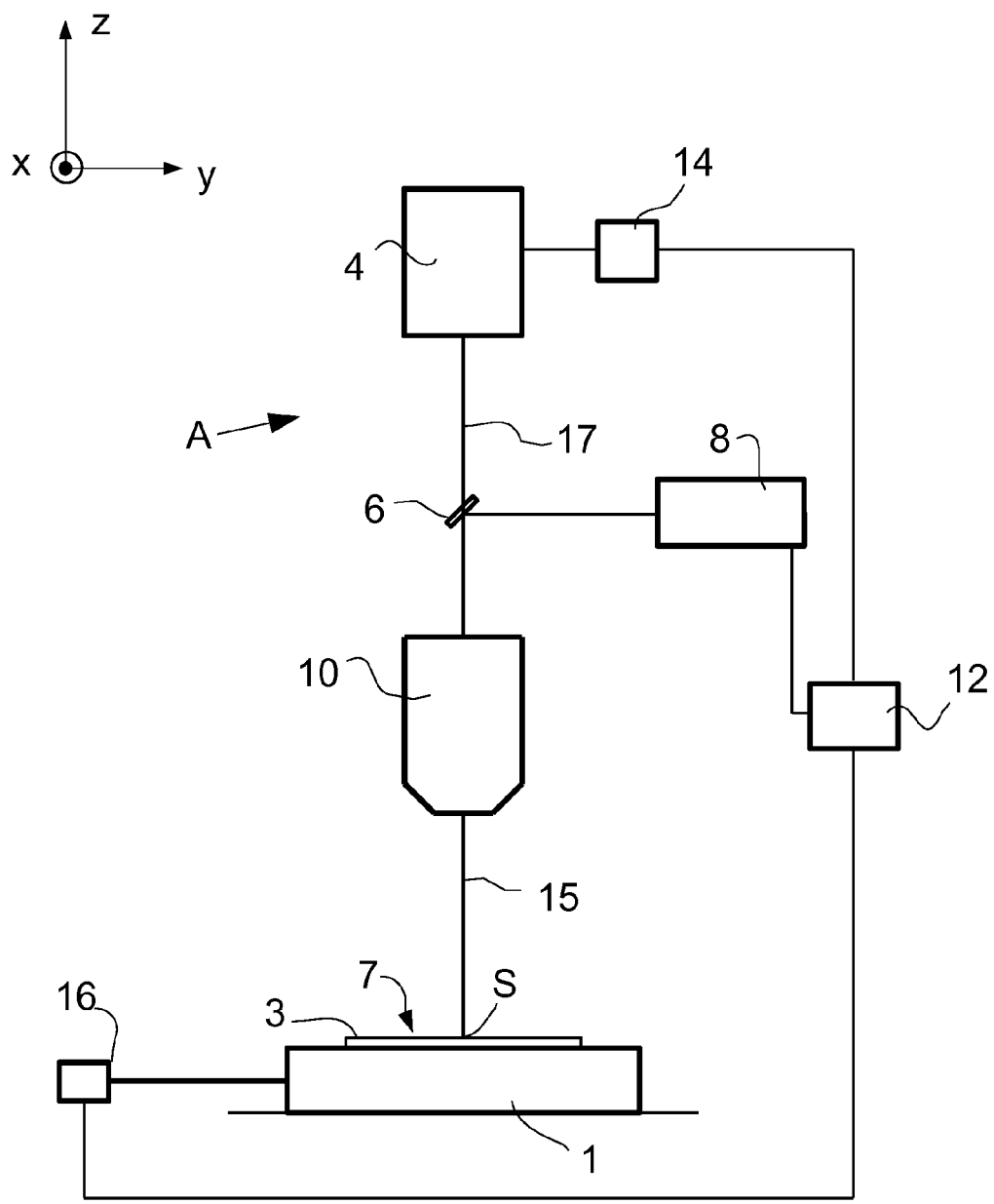
FIG. 5 renders an elevational view (along a −x axis) of a radiative scribing tool suitable for performing certain aspects of a method according to the current invention.

The scribes 11 are created using said radiative scribing tool, an aspect of which is represented by the focused laser beam 15, which is propagating along an optical axis 17 and impinging upon the first major surface 7 (see also FIG. 5). The beam 15 is produced by a pulsed laser 4, which produces laser pulses with a pulse duration P≈15 picoseconds (ps). The laser beam 15 is scanned along each of the scribelines (in y, and also in x) so as to produce the scribes 11. Such scanning may be effected by moving the laser beam 15 and/or moving the table 1.

In FIG. 3, the foil 5 and wafer 3 have been placed upon another table 21, above which a picker arm 19 can be moved; this (highly schematic) picker arm 19 can take many forms, and may be based on a variety of operating principles—such as edge-grabbing and/or suction, for example—as will readily be appreciated and implementable by the skilled artisan. In accordance with the invention, the foil 5 has been laterally stretched along the direction of the arrows B, B' (and also along similar non-depicted arrows in the ±y direction), e.g., by causing the above-mentioned circumferential frame to expand outward with the aid of suitable actuators (not depicted). As a result of this lateral stretching, the second major surface 9 has been severed along the path of the scribes 11, by breaking the floors 13. This results in mutually isolated device-carrying wafer portions (i.e., dies) 23' that are separated from one another by gaps 211, at the bottom edges of which are the severance regions 213 of the floors 13. The portions 23' thus separated from one another can be grabbed and removed by the picker arm 19. As will be appreciated, a machine for separating diced wafers may be a separate machine from the machine including the scribing tools. Nonetheless, the two machines can collectively constitute a system for performing the operation.

Embodiment 2

FIG. 5 renders an elevational view of an apparatus A suitable for conducting aspects of the method according to the current invention, more particularly for radiatively scribing a semiconductor wafer 3 along a network of scribelines 2 (see FIG. 4) parallel to a major surface 7 of the wafer 3. The Figure shows:

A pulsed laser source 4, which outputs a pulsed laser beam 15 that propagates along an optical axis 17. The laser source 4 is connected to a controller 14 that can be used inter alia to control parameters such as the pulse duration and power/fluence of the beam 15.

A wafer table 1, onto which the wafer 3 is mounted to as to present the major surface 7 to the laser source 4. Such mounting conventionally occurs via peripheral clamping, for example.

A projection (i.e., imaging) system 10, for projecting the laser beam 15 upon the wafer 3. At the point of impingement of the beam 15 upon the wafer 3, a light spot S is formed. The projection system 10 may be used to focus the beam 15 onto (or into) the wafer 3, as desired, and may also perform aberration/distortion correction, for example.

A stage assembly 16, which can position the wafer table 1 relative to the beam 15, in the xy plane.

Figure 4:
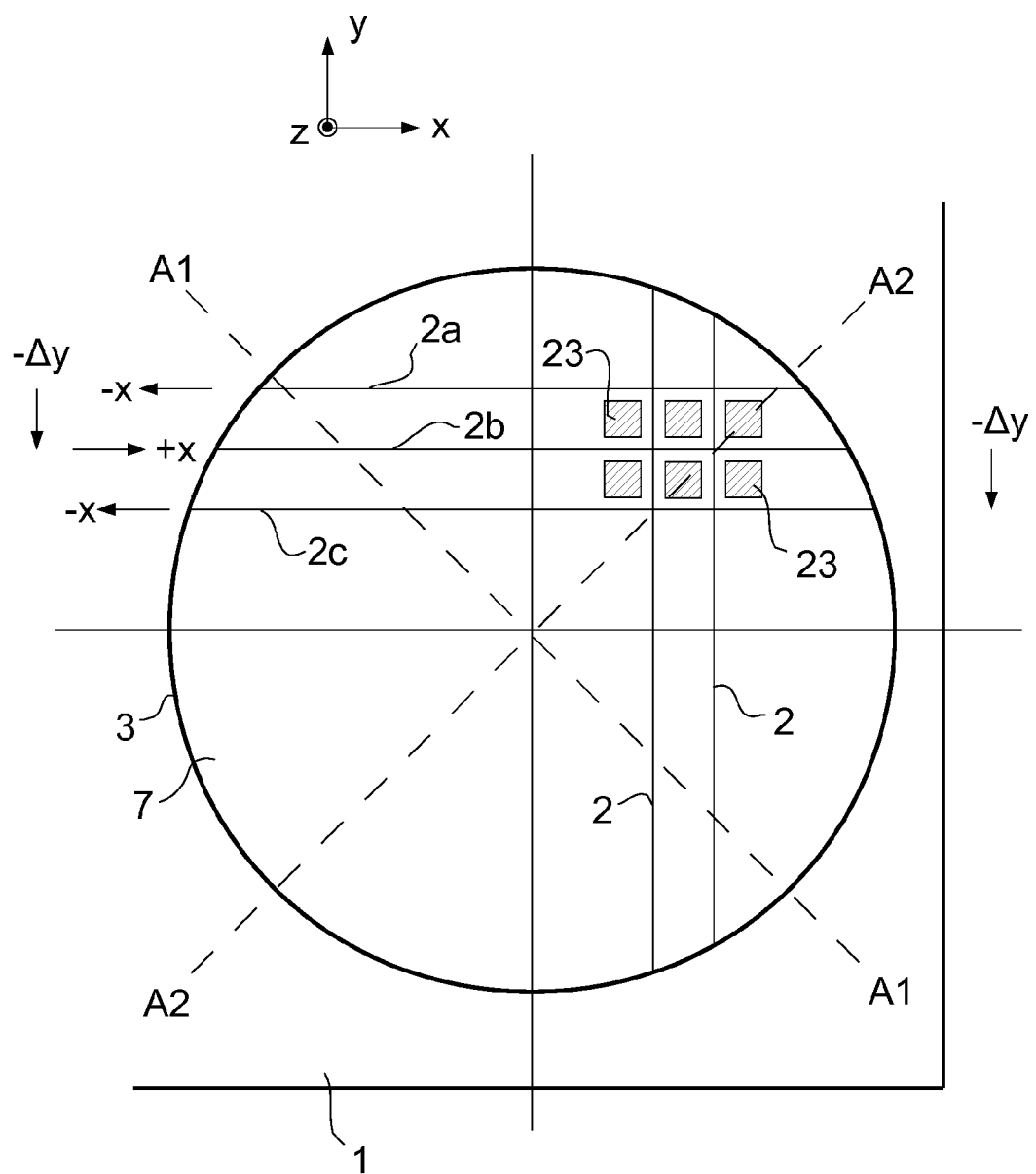
FIG. 4 renders a zoomed-out plan view (along a −z axis) of the subject of FIG. 1.

FIG. 4 shows the wafer 3 viewed from above, as it rests upon the wafer table 1. Upon the major surface 7, various scribelines 2 are illustrated. These scribelines 2 run in an x/y grid pattern between integrated devices 23 that are distributed in a matrix arrangement on the surface 7; there will generally be very many such devices 23 on a typical semiconductor wafer, but only a few have been illustrated here, so as not to clutter the drawing.

FIG. 4 depicts a "longitudinal scan and lateral step" approach to scribing the wafer 3 along multiple, successive scribelines 2 in a particular direction (in this case ±x). For example:

The wafer 3 is scribed along scribeline 2a by scanning the beam 15 in the −x direction; in practice, this relative motion can actually be achieved by using the stage assembly 16 (see FIG. 5) to scan the wafer table 1 in the +x direction.

After completing the scribing run along scribeline 2a, the stage assembly 16 will be used to step the wafer table 1 in the +y direction by an amount Δy; as a result, the beam 15 will effectively be stepped with respect to the wafer surface 7 by an amount −Δy.

The wafer 3 is now scribed along scribeline 2b by scanning the beam 15 in the +x direction; in practice, this relative motion can be achieved by using the stage assembly 16 to scan the wafer table 1 in the −x direction.

And so forth.

It should be noted that there are various ways of embodying the stage assembly 16, and the skilled artisan will be able to implement many alternatives in this regard. One particular embodiment, which is schematically depicted in FIG. 4, uses two separate linear motors (not depicted) to independently drive the wafer table 1 along axes A1 and A2, which subtend angles of 45° with the x, y axes; motion in x or y then involves concurrent driving along the A1 and A2 axes. Typically, the wafer table 1 will be caused to float smoothly over a reference surface (such as a polished stone surface) in the xy plane, e.g., with the aid of an air bearing or magnetic bearing (not depicted). The exact position of the wafer table 1 can be monitored and controlled with the aid of positioning instruments such as interferometers or linear encoders, for example (not depicted). In particular, focus control/level sensing (not depicted) will also typically be employed, to ensure that the surface 7 of the wafer 3 is maintained at a desired level with respect to the projection system 10. All such conventional positioning and control aspects will be very familiar to the skilled artisan, and do not require any further elucidation here.

Returning now to FIG. 5, the apparatus A further comprises:

A digital camera 8, which can be used to perform alignment/tracking operations of the beam 15 relative to the surface 7 of the wafer 3.

A beam splitter 6 (e.g., a dichroic mirror), which can be used to ensure that the camera 8 can be used in an "on-axis" arrangement, whereby it can observe the wafer 3 along an axis substantially collinear with the beam 15: a portion of light emanating from the surface 7 will strike beam splitter 6 and be reflected into the camera 8.

A controller 12 for controlling/processing image capture by the camera 8.

What is claimed is:

1. A method of singulating a semiconductor wafer by partitioning it along a network of scribelines, the wafer having two substantially parallel major surfaces that are separated from one another by a thickness T<200 μm, said scribelines extending along a first of said major surfaces, comprising:
   adhering the second major surface of the wafer to an elastic foil, which is clamped to a wafer table so as to present the first major surface to a radiative scribing tool;
   using the radiative scribing tool to produce at least one pulsed laser beam having a pulse duration P≤75 ps;
   causing said laser beam to scan along each of said scribelines so as to create a radiative scribe with a depth D<T, thereby leaving the second major surface intact; and
   laterally stretching said foil so as to sever the second major surface along the path of said radiative scribes.

2. A method according to claim 1, wherein P<$C_{PP}$, in which $C_{PP}$ is the Time Constant of phonon-phonon coupling in the wafer at the location of incidence of the laser beam.

3. A method according to claim 2, wherein P<$C_{EP}$, in which $C_{EP}$ is the Time Constant of electron-phonon coupling in the wafer at the location of incidence of the laser beam.

4. A method according to claim 1, wherein the difference F=T−D is in the range 5-50 μm.

5. A method according to claim 4, wherein the difference F=T−D is in the range 10-30 μm.

6. A method according to claim 1, wherein:
   T is in the range 20-200 μm and P is in the range 0.1-55 ps.

7. A method as in claim 6, wherein T is in the range 30-150 μm, and P is in the range 1-20 ps.

8. A method as in claim 7, wherein T is in the range 40-100 μm, and P is in the range 5-15 ps.

9. A method according to claim 1, wherein, for a given scribeline, said radiative scribe is created as a cumulative result of a plurality of process steps, each step entailing a single scan of the laser along said scribeline.

10. A system for singulating a semiconductor wafer by partitioning it along a network of scribelines, the wafer having two substantially parallel major surfaces that are separated from one another by a thickness T<200 μm, said scribelines extending along a first of said major surfaces, the wafer being adhered to an elastic foil on a second of said major surfaces, comprising:
   a radiative scribing tool including a laser configured and arranged to generate a pulsed laser beam having a pulse duration P≤75 ps;
   a wafer table, constructed and arranged to hold the wafer such that the first major surface is exposed to the radiative scribing tool;
   an actuator, configured and arranged to cause the laser beam to relatively scan along each of said scribelines so as to create a radiative scribe with a depth D<T, thereby leaving the second major surface intact; and
   actuators constructed and arranged to laterally stretch said foil so as to sever the second major surface along the path of said radiative scribes.

* * * * *